United States Patent
Omi et al.

(10) Patent No.: US 10,125,417 B2
(45) Date of Patent: Nov. 13, 2018

(54) SINTERED OXIDE, METHOD FOR ITS PRODUCTION, AND SPUTTERING TARGET

(71) Applicant: TOSOH CORPORATION, Shunan-shi, Yamaguchi (JP)

(72) Inventors: Kenji Omi, Kanagawa (JP); Kenichi Itoh, Kanagawa (JP); Kentarou Utsumi, Tokyo (JP)

(73) Assignee: TOSOH CORPORATION, Shunan-shi, Yamaguchi (JP)

( * ) Notice: Subject to any disclaimer, the term of this patent is extended or adjusted under 35 U.S.C. 154(b) by 9 days.

(21) Appl. No.: 15/325,105

(22) PCT Filed: Jul. 27, 2015

(86) PCT No.: PCT/JP2015/071261
§ 371 (c)(1),
(2) Date: Jan. 10, 2017

(87) PCT Pub. No.: WO2016/017589
PCT Pub. Date: Feb. 4, 2016

(65) Prior Publication Data
US 2017/0191153 A1    Jul. 6, 2017

(30) Foreign Application Priority Data

Jul. 31, 2014 (JP) .............................. 2014-156608

(51) Int. Cl.
| | |
|---|---|
| H01B 1/08 | (2006.01) |
| C04B 35/45 | (2006.01) |
| C23C 14/08 | (2006.01) |
| C04B 35/453 | (2006.01) |
| C23C 14/34 | (2006.01) |
| C04B 35/462 | (2006.01) |
| C04B 35/64 | (2006.01) |
| H01B 1/02 | (2006.01) |
| H01B 5/14 | (2006.01) |
| C04B 35/44 | (2006.01) |

(52) U.S. Cl.
CPC ............ *C23C 14/086* (2013.01); *C04B 35/44* (2013.01); *C04B 35/453* (2013.01); *C04B 35/462* (2013.01); *C04B 35/64* (2013.01); *C23C 14/08* (2013.01); *C23C 14/081* (2013.01); *C23C 14/083* (2013.01); *C23C 14/34* (2013.01); *C23C 14/3414* (2013.01); *H01B 1/023* (2013.01); *H01B 1/08* (2013.01); *H01B 5/14* (2013.01); *C04B 2235/3217* (2013.01); *C04B 2235/3222* (2013.01); *C04B 2235/3232* (2013.01); *C04B 2235/3234* (2013.01); *C04B 2235/3284* (2013.01); *C04B 2235/5409* (2013.01); *C04B 2235/5436* (2013.01); *C04B 2235/5445* (2013.01); *C04B 2235/5463* (2013.01); *C04B 2235/602* (2013.01); *C04B 2235/656* (2013.01); *C04B 2235/6562* (2013.01); *C04B 2235/6565* (2013.01); *C04B 2235/6567* (2013.01); *C04B 2235/6585* (2013.01); *C04B 2235/6586* (2013.01); *C04B 2235/77* (2013.01); *C04B 2235/80* (2013.01)

(58) Field of Classification Search
CPC ............ H01B 1/00; H01B 1/08; C04B 35/453
See application file for complete search history.

(56) References Cited

U.S. PATENT DOCUMENTS

| | | | |
|---|---|---|---|
| 4,736,183 A * | 4/1988 | Yamazaki | H01C 7/001 218/143 |
| 2006/0105180 A1 | 5/2006 | Schicht et al. | |
| 2009/0134013 A1 | 5/2009 | Takahashi et al. | |

FOREIGN PATENT DOCUMENTS

| | | |
|---|---|---|
| JP | 2005-179129 A | 7/2005 |
| JP | 2006-505482 A | 2/2006 |
| JP | 2009-298649 A | 12/2009 |
| JP | 2009298649 A * | 12/2009 |
| JP | 2011-93717 A | 5/2011 |
| JP | 2013-209741 A | 10/2013 |
| WO | 2008/013237 A1 | 1/2008 |

OTHER PUBLICATIONS

International Search Report of PCT/JP2015/071261, dated Oct. 27, 2015. [PCT/ISA/210].

* cited by examiner

*Primary Examiner* — Mark Kopec
(74) *Attorney, Agent, or Firm* — Sughrue Mion, PLLC

(57) ABSTRACT

The purpose of the present invention is to provide a sintered oxide to be used for a sputtering target, whereby little abnormal discharge occurs even during high-power film-deposition and no cracking occurs in the target. A sintered oxide having zinc, aluminum, titanium and oxygen, as constituent elements, characterized in that when the contents of zinc, aluminum and titanium are represented by Zn, Al, and Ti, respectively, the atomic ratios of the elements constituting the sintered oxide are $$Al/(Zn+Al+Ti)=0.035 \text{ to } 0.050 \text{ and}$$

$$Ti/(Zn+Al+Ti)=0.05 \text{ to } 0.20,$$

and the average grain size of crystal grains having a $Zn_2TiO_4$ crystal phase as the matrix phase in the sintered oxide, is at most 5 μm.

6 Claims, No Drawings

SINTERED OXIDE, METHOD FOR ITS PRODUCTION, AND SPUTTERING TARGET

CROSS REFERENCE TO RELATED APPLICATIONS this application is a National Stage of International Application No. PCT/JP2015/071261 filed Jul. 27, 2015, claiming priority based on Japanese Patent Application No. 2014-156608, filed Jul. 31, 2014, the contents of all of which are incorporated herein by reference in their entirety.

TECHNICAL FIELD

The present invention relates to a sintered oxide comprising zinc, aluminum, titanium and oxygen as constituent elements, and a sputtering target comprising the sintered oxide.

BACKGROUND ART

In recent years, a high refractive index film has been employed for adjusting the refractive index in a portable display or building material glass. A representative example of a high refractive index target is a titanium oxide target, but its resistance value is extremely high, and it has a problem that DC sputtering with high mass productivity is thereby difficult. To deal with this problem, a technology to enable DC discharge by lowering the resistivity by addition of a very small amount of a dopant, has been reported (see e.g. Patent Document 1). However, titanium oxide-type oxide material has a strong binding strength between titanium and oxygen and thus is not readily atomized during sputtering, whereby it has a problem that the film-deposition rate is extremely slow.

Further, as a high refractive index target, a sintered composite oxide comprising zinc, aluminum and titanium, has also been reported (see e.g. Patent Document 2). A zinc oxide-type target containing titanium is reported to be adapted to obtain a sintered composite oxide which achieves a high refractive index of 2.0 or more and which has a stable DC discharge performance with little arcing.

However, in recent years, adoption of a cylindrical target capable of applying a high power load, has progressed, and film-deposition wherein a high power which has not been heretofore expected, is applied, is becoming mainstream. Therefore, there is an increasing need for a high refractive index target capable of stable DC discharge which is free from arcing or target cracking even when a high power is applied.

PRIOR ART DOCUMENTS

Patent Documents

Patent Document 1: JP-A-2005-179129
Patent Document 2: JP-A-2009-298649

DISCLOSURE OF INVENTION

Technical Problem

The purpose of the present invention is to provide a sintered oxide to be used for a sputtering target, whereby little abnormal discharge occurs even during high-power film-deposition and no cracking occurs in the target.

Solution to Problem

The present inventors have conducted intensive studies on causes of the arcing phenomenon and cracking of a high refractive index composite oxide having $TiO_2$ added to ZnO. As a result, they have found that a $Zn_2TiO_4$ crystal phase formed by ZnO and $TiO_2$ tends to undergo abnormal grain growth, and if it remains as crystals larger than a certain size in the target, a very large charge will be accumulated at the time of application of high power and vigorous abnormal discharge will be caused.

Further, it has been found that a $Zn_2TiO_4$ crystal phase larger than a certain size will also be influential over the strength of the sintered oxide. In the vicinity of tissues of an abnormally grain-grown $Zn_2TiO_4$ crystal phase, the grain boundary strength of the crystal phase partially lowers, which lowers the strength of the entire target, thus causing arching while cracking.

In view of the above points, the present invention is based on finding that by controlling abnormal grain growth of the $Zn_2TiO_4$ phase, it is possible to obtain a sintered oxide capable of preventing arcing at the time of application of a high power and cracking of the target.

That is, the present invention provides the following.
(1) A sintered oxide having zinc, aluminum, titanium and oxygen as constituent elements, characterized in that when the contents of zinc, aluminum and titanium are represented by Zn, Al, and Ti, respectively, the atomic ratios of the elements constituting the sintered oxide are $$Al/(Zn+Al+Ti)=0.035 \text{ to } 0.050 \text{ and}$$

$$Ti/(Zn+Al+Ti)=0.05 \text{ to } 0.20,$$

and the average grain size of crystal grains having a $Zn_2TiO_4$ crystal phase as the matrix phase in the sintered oxide, is at most 5 μm.
(2) The sintered oxide according to (1), characterized in that crystal grains having a $Zn_2TiO_4$ crystal phase as the matrix phase and having a grain size exceeding 20 μm, are not present in the sintered oxide.
(3) The sintered oxide according to (1) or (2), characterized in that in the X-ray diffraction of the sintered oxide, no diffraction peak of aluminum oxide phase is present.
(4) The sintered oxide according to any one of (1) to (3), characterized in that the relative density is at least 98%.
(5) The sintered oxide according to any one of (1) to (4), characterized in that the bending strength is at least 150 MPa.
(6) A sputtering target characterized by using the sintered oxide as defined in any one of (1) to (5), as target material.
(7) A thin film characterized in that it is film-deposited by sputtering using the sputtering target as defined in (6).
(8) A method for producing a sintered oxide, characterized by mixing zinc oxide powder, titanium oxide powder and aluminum oxide powder having a BET specific surface area of at least 10 $m^2/g$, as raw material powders, so that when the contents of zinc, aluminum and titanium are represented by Zn, Al, and Ti, respectively, the atomic ratios of the elements would be $$Al/(Zn+Al+Ti)=0.035 \text{ to } 0.050 \text{ and}$$

$$Ti/(Zn+Al+Ti)=0.05 \text{ to } 0.20,$$

followed by molding, and then, firing the obtained molded product.

(9) The method for producing a sintered oxide according to (8), characterized by firing at a temperature of at most 1300° C. in the atmospheric air or in an inert gas atmosphere.

Now, the present invention will be described in detail.

The present invention is a sintered oxide having zinc, aluminum, titanium and oxygen as constituent elements, characterized in that when the contents of zinc, aluminum and titanium are represented by Zn, Al, and Ti, respectively, the atomic ratios of the elements constituting the sintered oxide are Al/(Zn+Al+Ti)=0.035 to 0.050 and Ti/(Zn+Al+Ti)=0.05 to 0.20, and the average grain size of crystal grains having a $Zn_2TiO_4$ crystal phase as the matrix phase in the sintered oxide, is at most 5 µm.

The sintered oxide of the present invention is characterized by having zinc, aluminum and titanium as constituent elements. Zinc is one to secure electrical conductivity of the sintered oxide, and titanium is one whereby a film obtainable by sputtering secures a desired high refractive index. A titanium oxide phase having a high insulation property will form, together with zinc oxide, a $Zn_2TiO_4$ phase as a composite oxide phase, whereupon a titanium oxide phase will no longer be contained in the sintered oxide. Further, by adding aluminum, the electrical conductivity will be improved, whereby the sintered oxide of the present invention will be capable of stable DC discharge.

The present invention is characterized in that when the contents of zinc, aluminum and titanium are represented by Zn, Al and Ti, respectively, the atomic ratios of the elements constituting the sintered oxide, are Al/(Zn+Al+Ti)=0.035 to 0.050 and Ti/(Zn+Al+Ti)=0.05 to 0.20. Within such a composition range, it becomes possible to control abnormal grain growth of a $Zn_2TiO_4$ phase to be formed by titanium oxide and zinc oxide.

Al/(Zn+Al+Ti) is from 0.035 to 0.050, preferably from 0.037 to 0.046. If Al/(Zn+Al+Ti) is less than 0.035, it tends to be difficult to control abnormal grain growth of a $Zn_2TiO_4$ phase, and if Al/(Zn+Al+Ti) exceeds 0.050, aluminum unable to be solid-solubilized in the zinc oxide phase will be precipitated as insulating aluminum oxide or its composite oxide in grain boundaries of the sintered oxide, whereby the resistivity of the sintered oxide becomes high.

Further, Ti/(Zn+Al+Ti) is 0.05 to 0.20, preferably from 0.05 to 0.19. If Ti/(Zn+Al+Ti) is less than 0.05, the refractive index of a film obtainable by sputtering tends to be lowered, and if Ti/(Zn+Al+Ti) exceeds 0.20, the resistivity of the sintered oxide tends to sharply increase, whereby stable DC discharge becomes impossible.

The sintered oxide of the present invention is composed mainly of crystal grains having a ZnO phase as the matrix phase and crystal grains having a $Zn_2TiO_4$ phase as the matrix phase. But, if a difference in the grain size occurs between the ZnO phase and the $Zn_2TiO_4$ phase in the sintered oxide, the strength at the grain boundary portions becomes unbalanced, and it may become a sintered oxide weak to a heat shock. Therefore, the average grain size of crystal grains having a $Zn_2TiO_4$ phase as the matrix phase, is preferably at most 5 µm, more preferably at most 3.5 µm. Further, it is more preferred that crystal grains having a $Zn_2TiO_4$ phase exceeding a grain size of 20 µm as the matrix phase are not present, and it is particularly preferred that crystal grains having a $Zn_2TiO_4$ phase exceeding a grain size of 10 µm as the matrix phase are not present.

Further, in the present invention, it is preferred that in the X-ray diffraction of the obtained sintered oxide, no diffraction peak corresponding to aluminum oxide is present, Because aluminum oxide being an insulator causes arcing during the sputtering. In the present invention, by using aluminum oxide powder having a BET specific surface area of at least 10 m²/g, the firing temperature can be made to be a relatively low temperature, and re-aggregation or grain growth of excess aluminum oxide that can not be solid-solubilized in the ZnO phase is controlled, whereby no X-ray diffraction peak of aluminum oxide will appear.

The sintered oxide of the present invention preferably has a relative density of at least 98%. Because, if the relative density is less than 98%, the frequency of arcing tends to increase.

Further, the sintered oxide of the present invention has a bulk resistance of preferably at most 10 Ωcm, more preferably at most 1 Ωcm, further preferably at most 0.1 Ωcm, in order to perform stable DC discharge.

The sintered oxide of the present invention has a bending strength of preferably at least 150 MPa, more preferably at least 180 MPa. When the bending strength is at least 150 MPa, no cracking takes place even in the grinding process, and the productivity will be good because of a high yield. Further, even in a case where it is used for a cylindrical sputtering target to which a high power is applied during the sputtering, a problem of cracking hardly occurs.

Here, the input load on the target is stipulated by a power density (W/cm²) obtained by dividing the input power by the erosion area of the target. A usual power density in a usual production is at a level of from 1 to 2.5 W/cm², but in the present invention, it is possible to obtain a sintered oxide which becomes a high quality target material whereby arcing tends to be extremely less even under a high power condition of at least 4 W/cm².

The method for producing a sintered oxide of the present invention is characterized by mixing zinc oxide powder, titanium oxide powder and aluminum oxide powder having a BET specific surface area of at least 10 m²/g, as raw material powders, so that when the contents of zinc, aluminum and titanium are represented by Zn, Al and Ti, respectively, the atomic ratios of the elements would be Al/(Zn+Al+Ti)=0.035 to 0.050 and Ti/(Zn+Al+Ti)=0.05 to 0.20, followed by molding, and then firing the obtained molded product.

Hereinafter, the method for producing a sintered oxide of the present invention will be described step by step.

(1) Raw Material Mixing Step

The raw material powders are preferably the respective oxide powders of zinc oxide, aluminum oxide and titanium oxide in consideration of the handling efficiency. The purity of each raw material powder is preferably at least 99.9%, more preferably at least 99.99%. Inclusion of impurities is likely to cause abnormal grain growth in the firing step, such being undesirable.

With respect to the aluminum oxide powder, it is necessary to use one having a BET specific surface area of at least 10 m²/g. With aluminum oxide powder having a BET specific surface area of less than 10 m²/g, it is not possible to prevent the vigorous grain growth of the $Zn_2TiO_4$ phase to be formed at the time of firing. Further, as the aluminum oxide powder, it is preferred to use one having D50 being from 0.15 to 0.35 µm, and D90 being from 0.30 µm to 0.65 µm.

In the raw material mixing step, it is necessary to mix zinc oxide powder, aluminum oxide powder and titanium oxide powder, so that when the contents of zinc, aluminum and titanium are represented by Zn, Al and Ti, respectively, the atomic ratios of the elements become to be Al/(Zn+Al+Ti)=0.035 to 0.050

Ti/(Zn+Al+Ti)=0.05 to 0.20, preferably to be

Al/(Zn+Al+Ti)=0.037 to 0.046

Ti/(Zn+Al+Ti)=0.05 to 0.19.

Further, in order to control the grain growth of the $Zn_2TiO_4$ phase, the raw material powders are preferably mixed uniformly. For uniform mixing, the BET specific surface area of the mixed powder after pulverizing and mixing is desired to be higher by preferably at least 1 $m^2$/g, more preferably at least 2 $m^2$/g, than the BET specific surface area of the zinc oxide powder as the main constituent raw material. If the BET specific surface area of the mixed powder is too high, the moldability of the powder is lowered, and therefore, it is preferably adjusted to be at most 15 $m^2$/g.

The pulverizing and mixing treatment of each of these powders is not particularly limited so long as it is one capable of uniform mixing, but a pulverizing and mixing method such as a dry or wet media stirring type mill employing balls or beads of zirconia, alumina, nylon resin, etc., or a media-less container rotary type, mechanical stirring type or airflow type, may be exemplified. Specifically, a ball mill, a bead mill, an attritor, a vibrating mill, a planetary mill, a jet mill, a biaxial planetary stirring mixer, etc, may be mentioned. In the case of using a wet process ball mill or bead mill, attritor, vibrating mill, planetary mill, jet mill, etc., it is necessary to dry the slurry after pulverizing. The drying method is not particularly limited, but, for example, filtration and drying, fluidized bed drying, spray drying, etc. may be exemplified.

(2) Molding Step

The molding method is not particularly limited, and it is possible to suitably select a molding method capable of molding the mixed raw material powder into a desired shape. A press molding method, a cast molding method, an injection molding method, etc., may be exemplified.

The molding pressure is not particularly limited, so long as no generation of cracks, etc. occurs in the molded product, and the molded product is capable of handling, however, the molding density is preferably made to be high as much as possible. Therefore, it is also possible to use a method of e.g. cold isostatic press (CIP) molding. The CIP pressure is preferably at least 1 ton/$cm^2$, more preferably at least 2 ton/$cm^2$, particularly preferably from 2 to 3 ton/$cm^2$, to obtain a sufficient compaction effect.

(3) Firing Step

Then, the obtained molded product is treated to firing in e.g. an electric firing furnace. The temperature raising rate of the object to be fired is not particularly limited, but is usually in a range of from 20 to 600° C./hr. The temperature lowering rate is also not particularly limited, and may suitably be decided in consideration of the capacity of the sintering furnace, the size and shape, or crack susceptibility, of the sintered oxide, etc. The firing holding temperature is preferably in a range of from 1100 to 1300° C., and the holding time is preferably from 0.5 to 8 hours, more preferably from 1 to 5 hours. When the firing holding temperature and holding time are adjusted to be under these conditions, it will be easy to control abnormal grain growth of a $Zn_2TiO_4$ phase to be formed at the time of firing. The atmosphere during firing is not particularly limited, but it is preferably the atmospheric air or oxygen atmosphere in order to suppress sublimation of zinc.

(4) Target-Forming Step

The obtained sintered oxide is treated to grinding processing into a desired shape such as a plate-shape, a circular-shape, a cylindrical shape, etc., by means of a mechanical processing machine such as a surface grinder, a cylindrical grinding machine, a lathe, a cutting machine, a machining center, etc. Further, as the case requires, it is bonded to a backing plate or backing tube made of e.g. oxygen-free copper, titanium, etc. using indium solder, etc. to obtain a sputtering target using the sintered oxide of the present invention as target material.

The size of the sintered oxide is not particularly limited, but the sintered oxide according to the present invention has a high strength, whereby it becomes possible to produce a large-sized target. In the case of a flat plate-shaped sputtering target, it becomes possible to prepare a large-sized sintered oxide of at least vertical 310 mm×horizontal 420 mm (area of the target surface: at least 1302 $cm^2$), and in the case of a cylindrical sputtering target, it becomes possible to prepare a large-sized sintered oxide of at least an outer diameter of 91 mmΦ×170 mm (area of the target surface: at least 486 $cm^2$). Here, the area of the target surface refers to the area of the sintered oxide surface treated to sputtering. In the case of a multi-divided target composed of a plurality of sintered oxides, among the respective sintered oxides, the one with the maximum area of the sintered oxide surface treated to sputtering is adopted as the area of the target surface in the multi-divided target.

Advantageous Effects of Invention

The sintered oxide of the present invention has electrical conductivity, and when it is used as a sputtering target, DC discharge is possible, and even when a high power is applied, abnormal discharge (arcing) or cracking of the target is less likely to occur, and a deposited thin film becomes a high resistance film. Further, since the strength of the sintered oxide is high, processing becomes easy, and a large-sized target can be produced with good yield.

EXAMPLES

Now, the present invention will be described in further detail with reference to Examples, but the present invention is not limited thereto. Here, various measurements in Examples were carried out as follows.

(1) BET Specific Surface Area of Powder

The BET specific surface area of a powder was measured by a gas adsorption method by means of a specific surface area measuring apparatus (TriStar 3000, manufactured by Shimadzu Corporation).

(2) Particle Size Measurement of Powder

The particle size of a powder was measured by a laser diffraction scattering method by means of a particle size distribution measuring apparatus (SALD-7100, manufactured by Shimadzu Corporation), to obtain D50 (50% diameter) and 090 (90% diameter) in a volume frequency distribution.

(3) Density of Sintered Oxide

For the relative density of a sintered oxide, the bulk density was measured by the Archimedes method in conformity with JIS R 1634, and the relative density was obtained by dividing the bulk density by the true density. The true density of the sintered oxide was calculated from the arithmetic average represented by the following formula, wherein when Zn, Ti and Al in the sintered oxide are converted to oxides and represented by zinc oxide, titanium oxide and aluminum oxide, respectively, the respective amounts are a (g), b (g), and c (g), and the respective true densities are 5.606 (g/cm$^3$), 3.95 (g/cm$^3$) and 4.23 (g/cm$^3$):

$d=(a+b+c)/((a/5.606)+(b/3.95)+(c/4.23))$ (4) X-Ray Diffraction Test

The X-ray diffraction pattern in a range of 2θ=20 to 70° of a mirror-polished sintered oxide sample was measured.
  Scanning method: step-scan method (FT method)
  X-ray source: CuKα
  Power: 40 kV, 40 mA
  Step width: 0.01°

(5) Crystal Grain Size

A sample was mirror-polished, and the ZnO phase and the $Zn_2TiO_4$ phase were identified by a composition analysis by EPMA, whereupon the crystal grain size was measured by a diameter method from the SEM image. The sample was observed at optional three or more points, and for each, at least 300 grains were measured.
(EPMA Analysis Conditions)
  Apparatus: wavelength dispersive electron beam microanalyzer
  Accelerating voltage: 15 kV
  Irradiation current: 30 nA (6) Bending Strength Measured in accordance with JIS R 1601.
(Conditions for Measurement of Bending Strength)
  Test method: 3-point bending test
  Distance between fulcrums: 30 mm
  Sample size: 3 mm×4 mm×40 mm
  Head speed: 0.5 mm/min (7) Bulk Resistance An obtained sintered oxide was processed into a size of about 10 mm×20 mm×1 mmt, and a silver paste was applied to contact points (4 points) of the measuring probe, followed by measurement by a 4-terminal method by means of a particle size distribution measuring apparatus (Loresta HP MCP-T410, manufactured by Mitsubishi Petrochemical Co., Ltd.).

(8) Sputtering Evaluation

An obtained sintered oxide was processed into a size of 101.6 mmΦ×6 mmt and then bonded to a backing plate of oxygen-free copper by indium solder to obtain a sputtering target. By using this target, sputtering was carried out by varying the input power under the following conditions, whereby arcing measurement and observation of target cracking were conducted.
(Sputtering Conditions)
  Gas: argon+oxygen (3%)
  Pressure: 0.6 Pa
  Power source: DC
  Input power: 400 W (4.9 W/cm$^2$)
  600 W (7.4 W/cm$^2$)
  800 W (9.9 W/cm$^2$)
  Discharge time: 120 min each
  Arcing measurement condition (threshold voltage): sputtering voltage −50 [V].

Example 1

Zinc oxide powder, titanium oxide powder and a powder of aluminum oxide (a) having the powder properties as shown in Table 1, were weighed to attain the ratios of Al/(Zn+Al+Ti)=0.045 and Ti/(Zn+Al+Ti)=0.05. The weighed powders and iron core-containing resin balls having a diameter of 15 mm were put in a polyethylene pot and mixed for 20 hours by a dry ball mill. The powder after mixing was passed through a 300 μm sieve and molded by a mold press under a pressure of 300 kg/cm$^2$ to prepare a molded product of 120 mm×120 mm×8 mmt, followed by CIP treatment under a pressure of 2 ton/cm$^2$.

Then, the molded product was placed on an alumina setter and fired in a resistance heating type electric furnace under the following conditions (furnace capacity: 250 mm×250 mm×250 mm). The evaluation results of the obtained sintered oxide are shown in Table 2, and the sputtering evaluation results of the obtained sputtering target are shown in Table 3.
(Firing Conditions)
  Firing temperature: 1100° C.
  Holding time: 1 hour
  Temperature raising rate: 100° C./hr
  Atmosphere: oxygen flow atmosphere (200 mL/min)
  Temperature lowering rate: 300° C./hr.

Example 2

Using zinc oxide powder, titanium oxide powder and a powder of aluminum oxide (a) having the powder properties as shown in Table 1, in the ratios of Al/(Zn+Al+Ti)=0.040 and Ti/(Zn+Al+Ti)=0.1, a CIP treatment molded product was obtained under the same conditions as in Example 1. This molded product was placed on an alumina setter and fired in a resistance heating type electric furnace under the same conditions as in Example 1 except that the firing temperature was changed to 1200° C. and the holding time was changed to 3 hours. The evaluation results of the obtained sintered oxide are shown in Table 2, and the sputtering evaluation results of the obtained sputtering target are shown in Table 3.

Example 3

Using zinc oxide powder, titanium oxide powder and a powder of aluminum oxide (b) having the powder properties as shown in Table 1, in the ratios of Al/(Zn+Al+Ti)=0.038 and Ti/(Zn+Al+Ti)=0.19, a CIF treatment molded product was obtained under the same conditions as in Example 1, This molded product was placed on an alumina setter and fired in a resistance heating type electric furnace under the same conditions as in Example 1 except that the firing temperature was changed to 1300° C., and the holding time was changed to 5 hours. The evaluation results of the obtained sintered oxide are shown in Table 2, and the sputtering evaluation results of the obtained sputtering target are shown in Table 3.

Example 4

A sintered oxide was prepared under the same conditions as in Example 3 except that the mixing time in the dry ball mill was changed to 10 hours. The evaluation results of the obtained sintered oxide are shown in Table 2, and the sputtering evaluation results of the obtained sputtering target are shown in Table 3.

Example 5

A CIP treatment molded product was obtained under the same conditions as in Example 2 except that in the process for the preparation of the mixed powder, a wet bead mill and a spray dryer were used under the following conditions, and the obtained powder was passed through a sieve of 150 μm. This molded product was placed on an alumina setter and fired in a resistance heating type electric furnace under the same conditions as in Example 2 except that the holding time was changed to 1 hour.
(Bead Mill Conditions)
 Bead diameter: 0.3 mmΦ
 Beads filling rate: 85%
 Peripheral speed: 7 m/sec
 Number of passes: 10 times
 Slurry concentration: powder 60 wt %
(Spray Dryer Conditions)
 Hot air temperature: inlet 180° C., exit 120° C.
 Disk rotation number: 10000 rpm
The evaluation results of the obtained sintered oxide are shown in Table 2, and the sputtering evaluation results of the obtained sputtering target are shown in Table 3.
(Film Deposition Evaluation)
The film deposition was conducted under the following conditions using a sputtering target obtained in each of Examples 1 to 5, and thin film resistances were measured. Thin film resistances were all at least $10^5 \Omega$, i.e. high-resistance films.
(Sputtering Conditions)
 Gas: argon+oxygen (3%)
 Pressure: 0.6 Pa
 Power source: DC
 Input power: 400 W (4.9 W/cm$^2$)
 Film thickness: 80 nm
 Substrate: alkali-free glass (EAGLE XG manufactured by Corning, thickness: 0.7 Mm)
(Conditions for Measurement of Resistance)
 Apparatus: Loresta HP (MCP-T410, manufactured by Mitsubishi Petrochemical Co., Ltd.)
 Measurement method: four-terminal method.

Comparative Example 1

Using zinc oxide powder, titanium oxide powder and a powder of aluminum oxide (a) having the powder properties as shown in Table 1, in the ratios of Al/(Zn+Al+Ti)=0.025 and Ti/(Zn+Al+Ti)=0.10, a CIP treatment molded product was obtained under the same conditions as in Example 1. This molded product was placed on an alumina setter and fired in a resistance heating type electric furnace under the same conditions as in Example 1 except that the firing temperature was changed to 1250° C. and the holding time was changed to 5 hours. The evaluation results of the obtained sintered oxide are shown in Table 2, and the sputtering evaluation results of the sputtering target are shown in Table 3.

Comparative Example 2

Using zinc oxide powder, titanium oxide powder and a powder of aluminum oxide (a) having the powder properties as shown in Table 1, in the ratios of Al/(Zn+Al+Ti)=0.025 and Ti/(Zn+Al+Ti)=0.10, a CIP treatment molded product was obtained under the same conditions as in Example 1. This molded product was placed on an alumina setter and fired in a resistance heating type electric furnace under the same conditions as in Example 1 except that the firing temperature was changed to 1350° C. and the holding time was changed to 10 hours. The evaluation results of the obtained sintered oxide are shown in Table 2, and the sputtering evaluation results of the sputtering target are shown in Table 3.

Comparative Example 3

Using zinc oxide powder, titanium oxide powder and a powder of aluminum oxide (c) having the powder properties as shown in Table 1, in the ratios of Al/(Zn+Al+Ti)=0.040 and Ti/(Zn+Al+Ti)=0.10, a CIP treatment molded product was obtained under the same conditions as in Example 1. This molded product was placed on an alumina setter and fired in a resistance heating type electric furnace under the same conditions as in Example 1 except that the firing temperature was changed to 1250° C. and the holding time was changed to 5 hours. The evaluation results of the obtained sintered oxide are shown in Table 2, and the sputtering evaluation results of the sputtering target are shown in Table 3.

Comparative Example 4

Using zinc oxide powder, titanium oxide powder and a powder of aluminum oxide (c) having the powder properties as shown in Table 1, in the ratios of Al/(Zn+Al+Ti)=0.040 and Ti/(Zn+Al+Ti)=0.10, a CIF treatment molded product was obtained under the same conditions as in Example 1. This molded product was placed on an alumina setter and fired in a resistance heating type electric furnace under the same conditions as in Example 1 except that the firing temperature was changed to 1350° C. and the holding time was changed to 10 hours. The evaluation results of the obtained sintered oxide are shown in Table 2, and the sputtering evaluation results of the sputtering target are shown in Table 3.

Comparative Example 5

Using zinc oxide powder, titanium oxide powder and a powder of aluminum oxide (a) having the powder properties as shown in Table 1, in the ratios of Al/(Zn+Al+Ti)=0.040 and Ti/(Zn+Al+Ti)=0.25, a CIP treatment molded product was obtained under the same conditions as in Example 1, This molded product was placed on an alumina setter and fired in a resistance heating type electric furnace under the same conditions as in Example 1 except that the firing temperature was changed to 1350° C. and the holding time was changed to 5 hours. The evaluation results of the obtained sintered oxide are shown in Table 2. Since the obtained sintered oxide had a high bulk resistance, the sputtering evaluation was not conducted.

Example 6

Nine sheets of CIP treated molded product were obtained under the same conditions as in Example 2 except that molded products of 351 mm×477 mm×8 mmt were prepared under a pressure of 1 ton/cm$^2$ using a CIP molding type mold instead of the mold press, followed by CIP treatment under a pressure of 2 ton/cm$^2$. Then, these molded products were set on alumina setters and fired in a resistance heating type electric furnace (furnace capacity: 1500 mm×1200 mm×600 mm) under the same conditions as in Example 2 except that the oxygen flow rate was changed to 120 L/min. The obtained sintered oxides were processed into a size of 310 mm×420 mm×6 mmt, to obtain nine sheets of sintered oxide having no cracks. Then, three sheets of sintered oxide were bonded, as one set, to a backing plate of oxygen-free copper by indium solder to obtain a sputtering target. In this manner, three sputtering targets were obtained. The evaluation results of the obtained sintered oxides are shown in Table 2.

Example 7

Nine molded products were obtained under the same conditions as in Example 2 except that molded products having an inner diameter of 86 mm×an outer diameter of 116 mm×a length of 200 mm were prepared under a pressure of 2 ton/cm$^2$ using a CIP molding type mold instead of the mold press. Then, these molded products were set on alumina setters and fired in a resistance heating type electric furnace under the same conditions as in Example 2. The obtained sintered oxides were processed into an inner diameter of 77 mm×an outer diameter of 91 mm×a length of 170 mm, to obtain nine sintered oxides having no cracks. Then, three sintered oxides were bonded, as one set, to a titanium backing plate by indium solder to obtain a sputtering target. In this manner, three sputtering targets were obtained. The evaluation results of the obtained sintered oxides are shown in Table 2.

TABLE 1

| Raw material | Average grain size | | BET m$^2$/g |
|---|---|---|---|
| | D50 μm | D90 μm | |
| ZnO | 0.95 | 1.86 | 3.75 |
| TiO$_2$ | 1.05 | 2.02 | 6.8 |
| Al$_2$O$_3$ (a) | 0.16 | 0.31 | 16.5 |

TABLE 1-continued

| Raw material | Average grain size | | BET m$^2$/g |
|---|---|---|---|
| | D50 μm | D90 μm | |
| Al$_2$O$_3$ (b) | 0.36 | 0.64 | 10.3 |
| Al$_2$O$_3$ (c) | 0.95 | 1.26 | 8.3 |

TABLE 2

| | Al$_2$O$_3$ raw material | Composition Al/Zn + Al + Ti | Composition Ti/Zn + Al + Ti | BET increase value of mixed powder relative to ZnO powder (m$^2$/g) | Firing temperature (° C.) | Holding time (hr) | Density (%) |
|---|---|---|---|---|---|---|---|
| Ex. 1 | Al$_2$O$_3$ (a) | 0.045 | 0.05 | 1.19 | 1100 | 1 | >98 |
| Ex. 2 | Al$_2$O$_3$ (a) | 0.040 | 0.10 | 1.33 | 1200 | 3 | >98 |
| Ex. 3 | Al$_2$O$_3$ (b) | 0.038 | 0.19 | 1.45 | 1300 | 5 | >98 |
| Ex. 4 | Al$_2$O$_3$ (b) | 0.038 | 0.19 | 0.93 | 1300 | 5 | >98 |
| Ex. 5 | Al$_2$O$_3$ (a) | 0.040 | 0.10 | 2.98 | 1200 | 1 | >98 |
| Comp. Ex. 1 | Al$_2$O$_3$ (a) | 0.025 | 0.10 | 1.18 | 1250 | 5 | 97 |
| Comp. Ex. 2 | Al$_2$O$_3$ (a) | 0.025 | 0.10 | 1.18 | 1350 | 10 | >98 |
| Comp. Ex. 3 | Al$_2$O$_3$ (c) | 0.040 | 0.10 | 0.97 | 1250 | 5 | >98 |
| Comp. Ex. 4 | Al$_2$O$_3$ (c) | 0.040 | 0.10 | 0.97 | 1350 | 10 | >98 |
| Comp. Ex. 5 | Al$_2$O$_3$ (a) | 0.040 | 0.25 | 1.62 | 1350 | 5 | >98 |
| Ex. 6 | Al$_2$O$_3$ (a) | 0.040 | 0.10 | 1.33 | 1200 | 3 | >98 |
| Ex. 7 | Al$_2$O$_3$ (a) | 0.040 | 0.10 | 1.33 | 1200 | 3 | >98 |

| | Bending strength (MPa) | Bulk resistance (Ωcm) | X-ray diffraction peak of Al$_2$O$_3$ | Average grain size ZnO phase (μm) | Average grain size Zn$_2$TiO$_4$ phase (μm) | Maximum grain size (abnormal grains) Zn$_2$TiO$_4$ phase (μm) |
|---|---|---|---|---|---|---|
| Ex. 1 | 205 | 2.0 × 10$^{-3}$ | No | 1.29 | 0.9 | 3.2 |
| Ex. 2 | 202 | 4.1 × 10$^{-3}$ | No | 1.35 | 1.59 | 6.8 |
| Ex. 3 | 212 | 4.6 × 10$^{-2}$ | No | 1.39 | 3.46 | 9.8 |
| Ex. 4 | 163 | 5.4 × 10$^{-2}$ | No | 1.42 | 4.2 | 13.2 |
| Ex. 5 | 235 | 3.2 × 10$^{-3}$ | No | 1.21 | 1.01 | 2.8 |
| Comp. Ex. 1 | 122 | 2.3 × 10$^{-1}$ | Yes | 1.41 | 6.1 | 22.6 |
| Comp. Ex. 2 | 92 | 1.0 × 10$^{-1}$ | Yes | 1.61 | 8.5 | 30.9 |
| Comp. Ex. 3 | 133 | 6.7 × 10$^{-3}$ | Yes | 1.65 | 5.59 | 20.3 |
| Comp. Ex. 4 | 103 | 5.8 × 10$^{-3}$ | Yes | 1.65 | 11.3 | 38.5 |
| Comp. Ex. 5 | 108 | 3.2 × 10$^{4}$ | Yes | 1.58 | 7.1 | 28.3 |
| Ex. 6 | 200 | 5.1 × 10$^{-3}$ | No | 1.33 | 1.61 | 6.5 |
| Ex. 7 | 208 | 4.6 × 10$^{-3}$ | No | 1.31 | 1.56 | 6.0 |

TABLE 3

| | Arcing 400 W | | Arcing 600 W | | Arcing 800 W | |
|---|---|---|---|---|---|---|
| | Number of arcings | Cracking | Number of arcings | Cracking | Number of arcings | Cracking |
| Ex. 1 | 3 | No | 10 | No | 25 | No |
| Ex. 2 | 5 | No | 13 | No | 36 | No |
| Ex. 3 | 6 | No | 19 | No | 38 | No |
| Ex. 4 | 9 | No | 27 | No | 63 | No |
| Ex. 5 | 4 | No | 11 | No | 21 | No |
| Comp. Ex. 1 | 22 | No | 121 | Yes | 354 | Yes |
| Comp. Ex. 2 | 36 | No | 155 | Yes | 466 | Yes |
| Comp. Ex. 3 | 18 | No | 91 | Yes | 264 | Yes |
| Comp. Ex. 4 | 24 | No | 139 | Yes | 503 | Yes |

The present invention has been described in detail and with reference to specific Examples, but it is apparent to those skilled in the art that various changes and modifications can be made without departing from the spirit and scope of the present invention.

The entire disclosure of Japanese Patent Application No. 2014-156608 filed on Jul. 31, 2014 including specification, claims, drawings and summary is incorporated herein by reference in its entirety.

The invention claimed is:

1. A sintered oxide having zinc, aluminum, titanium and oxygen as constituent elements, characterized in that when the contents of zinc, aluminum and titanium are represented by Zn, Al, and Ti, respectively, the atomic ratios of the elements constituting the sintered oxide are Al/(Zn+Al+Ti)=0.035 to 0.050 and Ti/(Zn+Al+Ti)=0.05 to 0.20, and the average grain size of crystal grains having a $Zn_2TiO_4$ crystal phase as the matrix phase in the sintered oxide, is at most 5 μm.

2. The sintered oxide according to claim 1, characterized in that crystal grains having a $Zn_2TiO_4$ crystal phase as the matrix phase and having a grain size exceeding 20 μm, are not present in the sintered oxide.

3. The sintered oxide according to claim 1, characterized in that in the X-ray diffraction of the sintered oxide, no diffraction peak of aluminum oxide phase is present.

4. The sintered oxide according to claim 1, characterized in that the relative density is at least 98%.

5. The sintered oxide according to claim 1, characterized in that the bending strength is at least 150 MPa.

6. A sputtering target characterized by using the sintered oxide as defined in claim 1, as target material.

* * * * *